United States Patent
Tsai et al.

(10) Patent No.: US 10,095,281 B2
(45) Date of Patent: Oct. 9, 2018

(54) FIXING MECHANISM AND COMPUTER CHASSIS

(71) Applicants: LITE-ON ELECTRONICS (GUANGZHOU) LIMITED, Guangzhou (CN); Lite-On Technology Corporation, Taipei (TW)

(72) Inventors: Jen-Wei Tsai, Taipei (TW); Liang-Cheng Chiu, Taipei (TW); Chih-Cheng Huang, Taipei (TW)

(73) Assignees: LITE-ON ELECTRONICS (GUANGZHOU) LIMITED, Guangzhou (CN); Lite-On Technology Corporation, Taipei (TW)

( * ) Notice: Subject to any disclaimer, the term of this patent is extended or adjusted under 35 U.S.C. 154(b) by 0 days.

(21) Appl. No.: 15/871,086

(22) Filed: Jan. 15, 2018

(65) Prior Publication Data

US 2018/0232019 A1    Aug. 16, 2018

Related U.S. Application Data

(60) Provisional application No. 62/459,608, filed on Feb. 16, 2017.

(30) Foreign Application Priority Data

Jan. 8, 2018   (CN) ................. 2018 2 0023136 U

(51) Int. Cl.
*G06F 1/16*        (2006.01)
*H05K 5/00*        (2006.01)
(Continued)

(52) U.S. Cl.
CPC ............ *G06F 1/187* (2013.01); *G11B 33/128* (2013.01); *H05K 7/1422* (2013.01)

(58) Field of Classification Search
CPC . G06F 1/18; G06F 1/181; G06F 1/183; G06F 1/187; H05K 7/14; H05K 7/1401; H05K 7/1422; H05K 7/1427
(Continued)

(56) References Cited

U.S. PATENT DOCUMENTS 5,726,922 A * 3/1998 Womble ................. G06F 1/184
                                                  361/726
5,808,864 A * 9/1998 Jung ..................... G06F 1/184
                                                  361/679.32
(Continued)

*Primary Examiner* — Anthony Haughton
(74) *Attorney, Agent, or Firm* — JCIPRNET

(57) ABSTRACT

A fixing mechanism and a computer chassis are provided. The fixing mechanism includes a main member and a first locking member. The first locking member includes a fixing portion, a support portion and a stop portion. The fixing portion includes a first part and a second part, and two ends of the first part are respectively connected to the main member and the second part. The support portion is connected to the fix portion, and the second part and the support portion are respectively located on two opposite surfaces of the first part. The stop portion is connected to the support portion, and located on a bottom surface of the support portion. An electronic device is assembled in the main member, and the first locking member is locked to a circuit board of a computer chassis to fix the fixing mechanism in a casing of the computer chassis.

12 Claims, 5 Drawing Sheets

(51) Int. Cl.
*H05K 7/00* (2006.01)
*G06F 1/18* (2006.01)
*H05K 7/14* (2006.01)
*G11B 33/12* (2006.01)

(58) Field of Classification Search
USPC ...... 361/679.31–679.39, 724–727, 730, 732, 361/736, 741
See application file for complete search history.

(56) References Cited

U.S. PATENT DOCUMENTS

| | | | | |
|---|---|---|---|---|
| 6,937,476 B1* | 8/2005 | Chen | ........................ | G06F 1/184 361/732 |
| 7,012,803 B1* | 3/2006 | Austin | .................... | G06F 1/184 361/679.33 |
| 7,265,996 B2* | 9/2007 | Fan | ...................... | H05K 7/1408 312/223.2 |
| 2002/0017838 A1* | 2/2002 | Roesner | .................. | G06F 1/184 312/223.1 |
| 2002/0196600 A1* | 12/2002 | Park | ........................ | G06F 1/181 361/679.55 |
| 2003/0107880 A1* | 6/2003 | Yang | ....................... | G06F 1/181 361/796 |
| 2005/0146846 A1* | 7/2005 | Chen | ....................... | H05K 7/142 361/810 |
| 2005/0152106 A1* | 7/2005 | Coster | ..................... | G06F 1/181 361/679.58 |
| 2007/0019379 A1* | 1/2007 | Hsiao | ...................... | G06F 1/184 361/679.02 |
| 2012/0162868 A1* | 6/2012 | Liu | .......................... | G06F 1/187 361/679.01 |
| 2017/0293326 A1* | 10/2017 | Lin | .......................... | G06F 1/181 |

* cited by examiner

FIXING MECHANISM AND COMPUTER CHASSIS

CROSS-REFERENCE TO RELATED APPLICATION

This application claims the priority benefits of U.S. provisional application Ser. No. 62/459,608, filed on Feb. 16, 2017 and China application Ser. No. 201820023136.8, filed on Jan. 8, 2018. The entirety of each of the above-mentioned patent application is hereby incorporated by reference herein and made a part of this specification.

BACKGROUND OF THE INVENTION

Field of the Invention

The invention relates to a fixing mechanism and a computer chassis, and particularly relates to fixing mechanism used for fixing an electronic device and a computer chassis including the fixing mechanism.

Description of Related Art

A hard disk is generally installed in internal of a computer chassis, and in order to securely install the hard disk in the computer chassis, fastening members (for example, screws or bolts) are mainly adopted to fasten a fixing mechanism used for fixing the hard disk to a casing of the computer chassis. However, to use the fastening members to fasten the fixing mechanism used for fixing the hard disk to the casing requires a large amount of fastening members, by which not only disassembly and installation require a lot of time and manpower, but also a production speed is slow, which increases a production cost. In other words, such method is very unsuitable for the current popular trends of whole set assembly and tool-less disassembly.

SUMMARY OF THE INVENTION

The invention is directed to a fixing mechanism, adapted to fix and support an electronic device.

The invention is directed to a computer chassis including the aforementioned fixing mechanism, which has a low production cost and high product competitiveness.

The invention provides a fixing mechanism including a main member and a first locking member. The first locking member is disposed at one side of the main member, and the first locking member includes a fixing portion, a support portion and a stop portion. The fixing portion includes a first part and a second part, and two ends of the first part are respectively connected to the main member and the second part. The support portion is connected to the fix portion, and the second part and the support portion are respectively located on two opposite surfaces of the first part. The stop portion is connected to the support portion, and is located on a bottom surface of the support portion. An electronic device is adapted to be assembled in the main member, and the first locking member is adapted to locking a circuit board of a computer chassis, so as to fix the fixing mechanism in a casing of the computer chassis.

In an embodiment of the invention, the main member includes a top wall portion and two opposite sidewall portions connected to the top wall portion. Each of the sidewall portions has a plurality of assembly holes, and the electronic device is assembled with a plurality of assembly parts, and the plurality of assembly parts respectively penetrate through the plurality of assembly holes to fix the electronic device in the main member.

In an embodiment of the invention, each of the plurality of assembly holes has a first aperture portion and a second aperture portion communicatively connected to each other. An aperture of the first aperture portion is greater than an aperture of the second aperture portion. Each of the plurality of assembly parts is put through the first aperture portion and is fixed in the second aperture portion.

In an embodiment of the invention, one of the sidewall portions is configured with the first locking member, an inner surface of the other one of the sidewall portions has at least one strengthening portion. The strengthening portion has an accommodating opening, a first strengthening portion, a second strengthening portion, and a third strengthening portion. The second strengthening portion is located between the first strengthening portion and the third strengthening portion and defines the accommodating opening together with the first strengthening portion and the third strengthening portion. The accommodating opening is adapted to interfere the casing of the computer chassis to fix the fixing mechanism on the casing of the computer chassis.

In an embodiment of the invention, the fixing mechanism further includes a second locking member disposed at another side of the main member and connected to the main member. The second locking member has a bending portion, and the bending portion is adapted to locking the casing of the computer chassis to fix the fixing mechanism in the casing of the computer chassis.

In an embodiment of the invention, the fixing mechanism further includes a force exerting member connected to the support portion of the first locking member and including a connection portion and a force exerting portion. The connection portion is connected to the support portion and the force exerting portion, and an extending direction of the force exerting portion is the same with an extending direction of the support portion.

The invention provides a computer chassis including a casing, a circuit board, a fixing mechanism and an electronic device. The casing includes a bottom plate and a plurality of side plates. The side plates are connected to the bottom plate and define an accommodating space together with the bottom plate. The circuit board is disposed on the casing and is located in the accommodating space. The circuit board has a first position limiting opening and a second position limiting opening. The fixing mechanism is disposed on the casing, and is located in the accommodating space. The fixing mechanism includes a main member and a first locking member. The first locking member is disposed at one side of the main member, and the first locking member includes a fixing portion, a support portion and a stop portion. The fixing portion includes a first part and a second part, and two ends of the first part are respectively connected to the main member and the second part. The support portion is connected to the fix portion, and the second part and the support portion are respectively located on two opposite surfaces of the first part. The stop portion is connected to the support portion, and is located on a bottom surface of the support portion. The electronic device is assembled in the main member of the fixing mechanism, where the second part and the stop portion are respectively located in the first position limiting opening and the second position limiting opening to locking the first locking member to the circuit board, the support portion is located on the circuit board to support the electronic device, so as to fix the fixing mechanism in the casing.

In an embodiment of the invention, the computer chassis further includes a plurality of assembly parts assembled to the electronic device. The main member includes a top wall portion and two opposite sidewall portions connected to the top wall portion. Each of the sidewall portions has a plurality of assembly holes, and the plurality of assembly parts respectively penetrate through the plurality of assembly holes to fix the electronic device in the main member.

In an embodiment of the invention, each of the plurality of assembly holes has a first aperture portion and a second aperture portion communicatively connected to each other. An aperture of the first aperture portion is greater than an aperture of the second aperture portion. Each of the plurality of assembly parts is put through the first aperture portion and is fixed in the second aperture portion.

In an embodiment of the invention, a first inner surface of one of plurality of the side plates of the casing has a plurality of leaning portions, and each of the plurality of leaning portions has a first leaning portion and a second leaning portion. One of the two sidewall portions is configured with the first locking member, and a second inner surface of the other one of the two sidewall portions has a plurality of strengthening portions. Each of the plurality of strengthening portions has an accommodating opening, a first strengthening portion, a second strengthening portion, and a third strengthening portion. The second strengthening portion is located between the first strengthening portion and the third strengthening portion and defines the accommodating opening together with the first strengthening portion and the third strengthening portion. The leaning portion extends into the accommodating opening, and the first leaning portion is leaned against by the first strengthening portion, and the second leaning portion is located in the accommodating opening and provides displacement positioning of a horizontal direction to the second strengthening portion, so as to fix the fixing mechanism on the casing.

In an embodiment of the invention, the fixing mechanism further includes a second locking member disposed at another side of the main member and connected to the main member. The second locking member has a bending portion, one of the plurality of side plates of the casing has an assembly opening, and the bending portion is interfered with the assembly opening to fix the fixing mechanism in the casing.

In an embodiment of the invention, the fixing mechanism further includes a force exerting member connected to the support portion of the first locking member and including a connection portion and a force exerting portion. The connection portion is connected to the support portion and the force exerting portion, and an extending direction of the force exerting portion is the same with an extending direction of the support portion.

According to the above description, in the design of the fixing mechanism of the invention, the electronic device is adapted to be assembled in the main member, and the first locking member includes the fixing portion, the support portion and the stop portion, where the fixing portion includes the first part and the second part, the first part is connected to the main member and the support portion, and the stop portion is located on the bottom surface of the support portion. When the fixing mechanism assembled with the electronic device is assembled on the casing of the computer chassis, the second part of the fixing portion and the stop portion are respectively located in the first position limiting opening and the second position limiting opening of the circuit board, such that the first locking member is locked to the circuit board, and the support portion is located on the circuit board to support the electronic device, so as to fix the fixing mechanism in the casing. Through the aforementioned method, it is unnecessary to use other additional assembly components, so that the production cost of the computer chassis is effectively reduced to improve product competitiveness.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
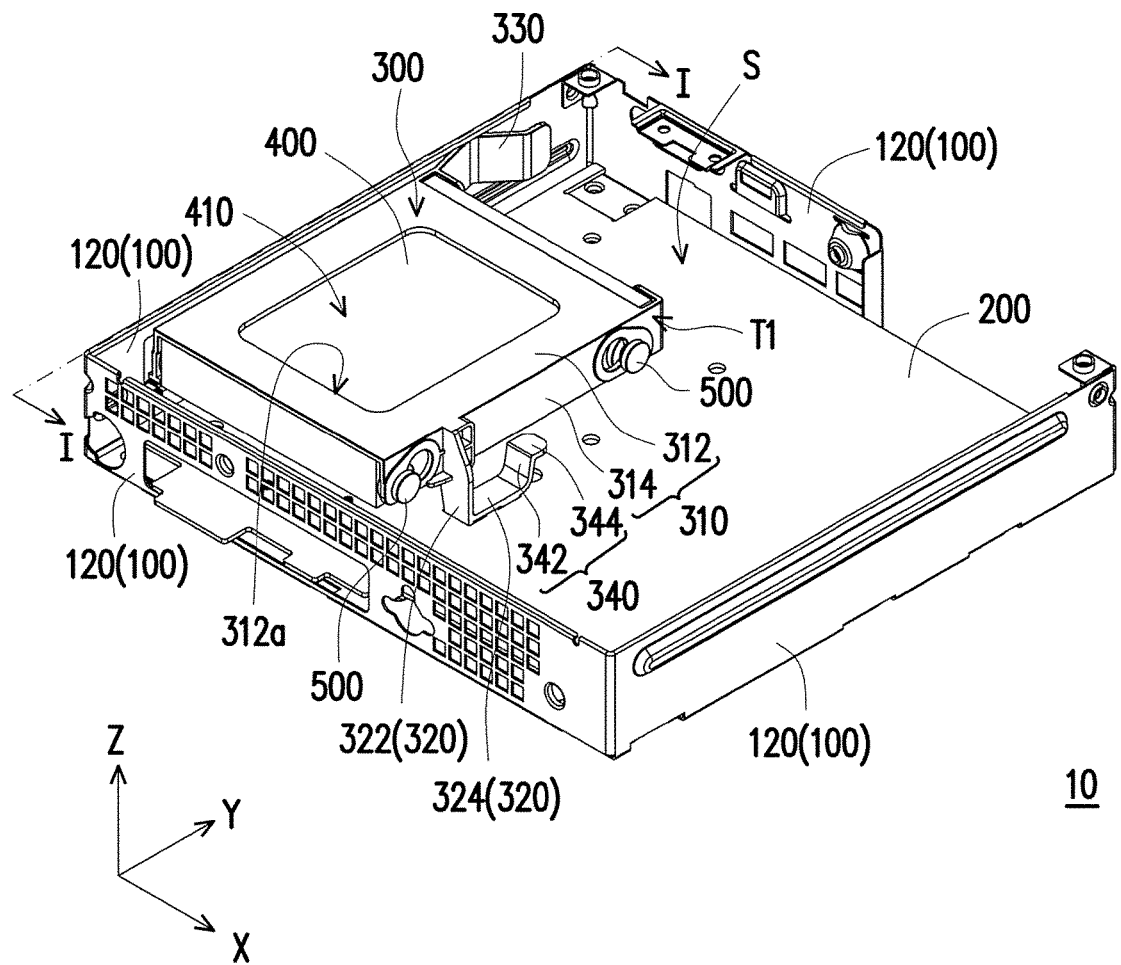
FIG. 1 is a three-dimensional (3D) view of a computer chassis according to an embodiment of the invention.
Figure 2:
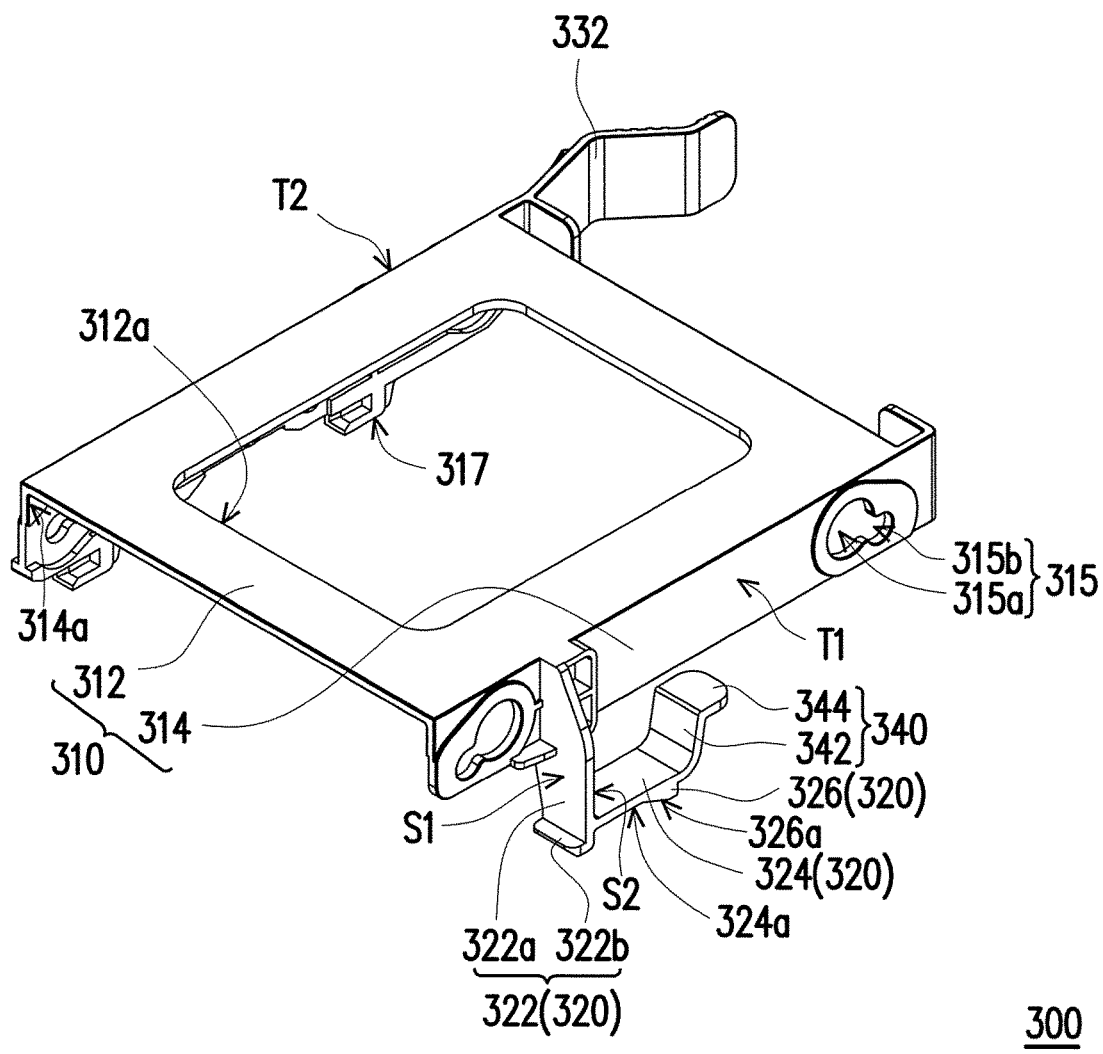
FIG. 2 is a three-dimensional view of a fixing mechanism of the computer chassis of FIG. 1.
Figure 3:
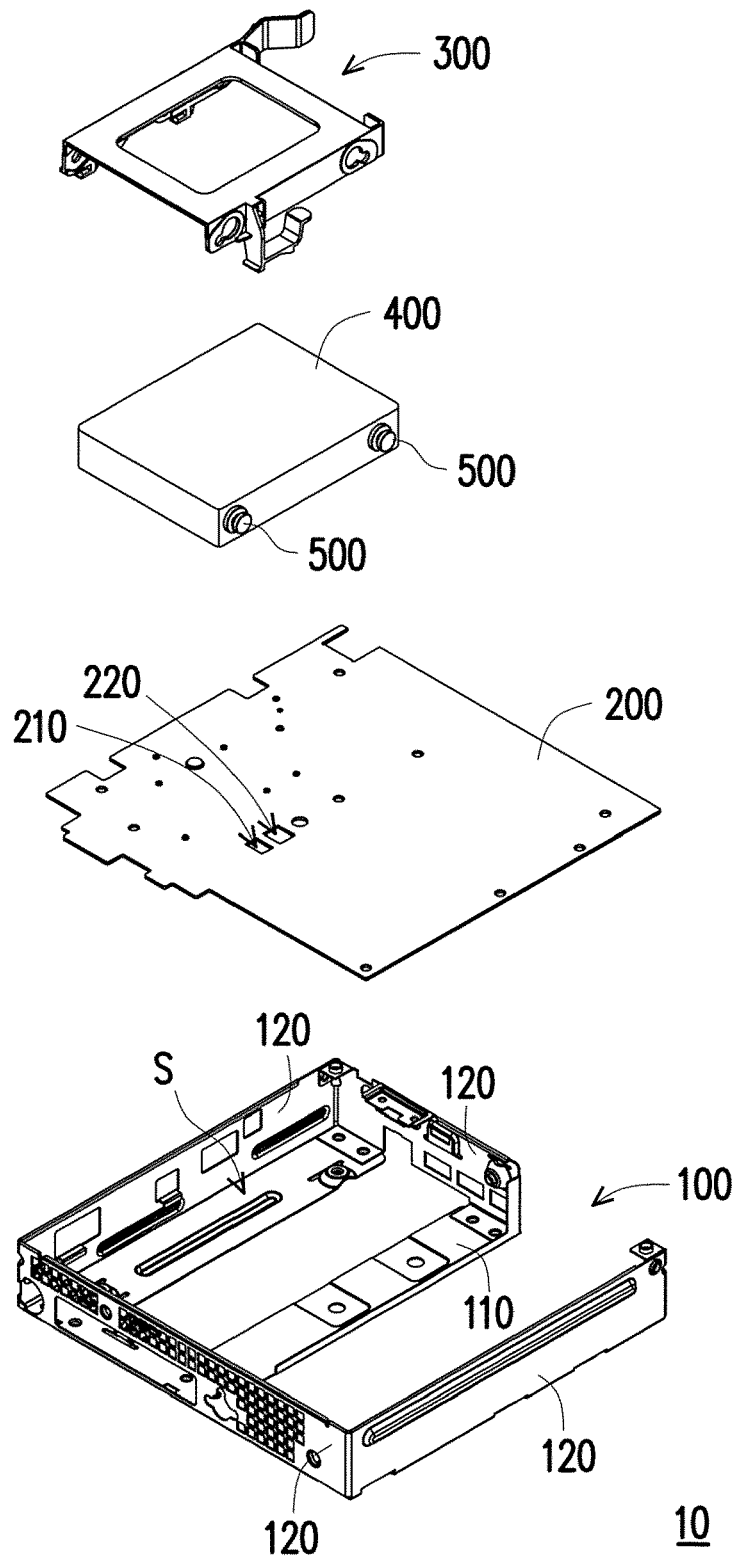
FIG. 3 is a 3D exploded view of the computer chassis of FIG. 1.
Figure 4:
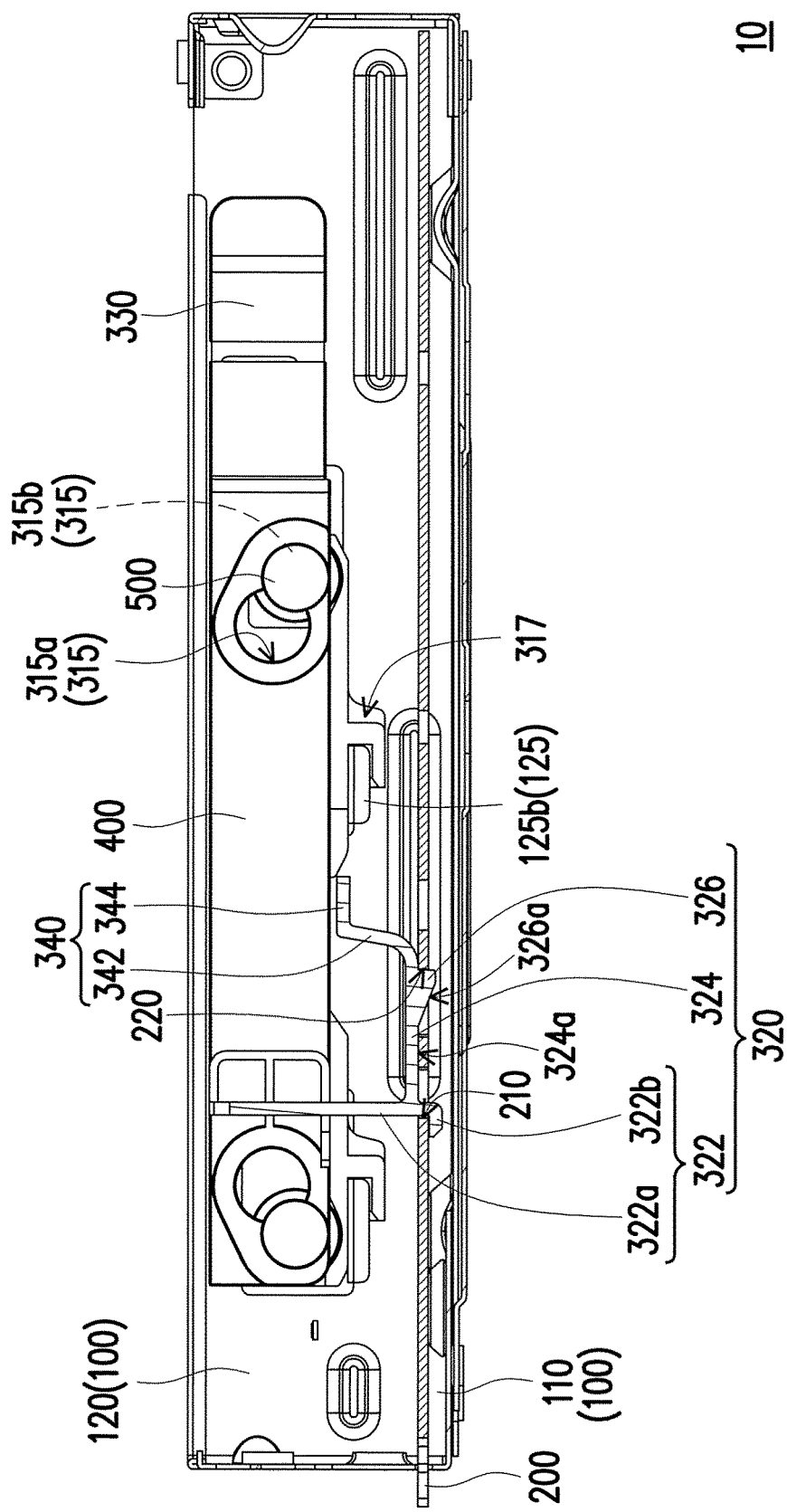
FIG. 4 is a partial cross-sectional view of the computer chassis of FIG. 1.
Figure 5:
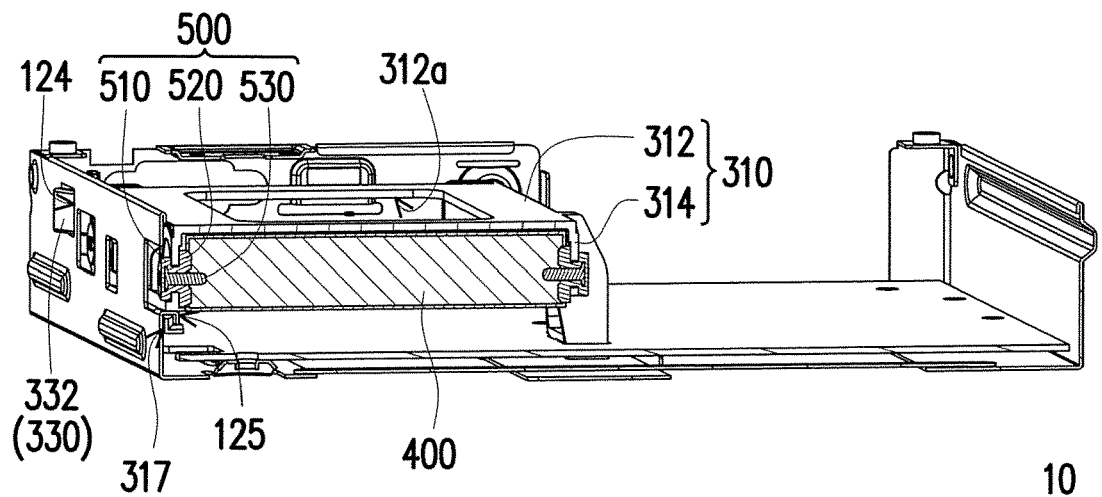
FIG. 5 is a partial 3D cross-sectional view of the computer chassis of FIG. 1.
Figure 6:
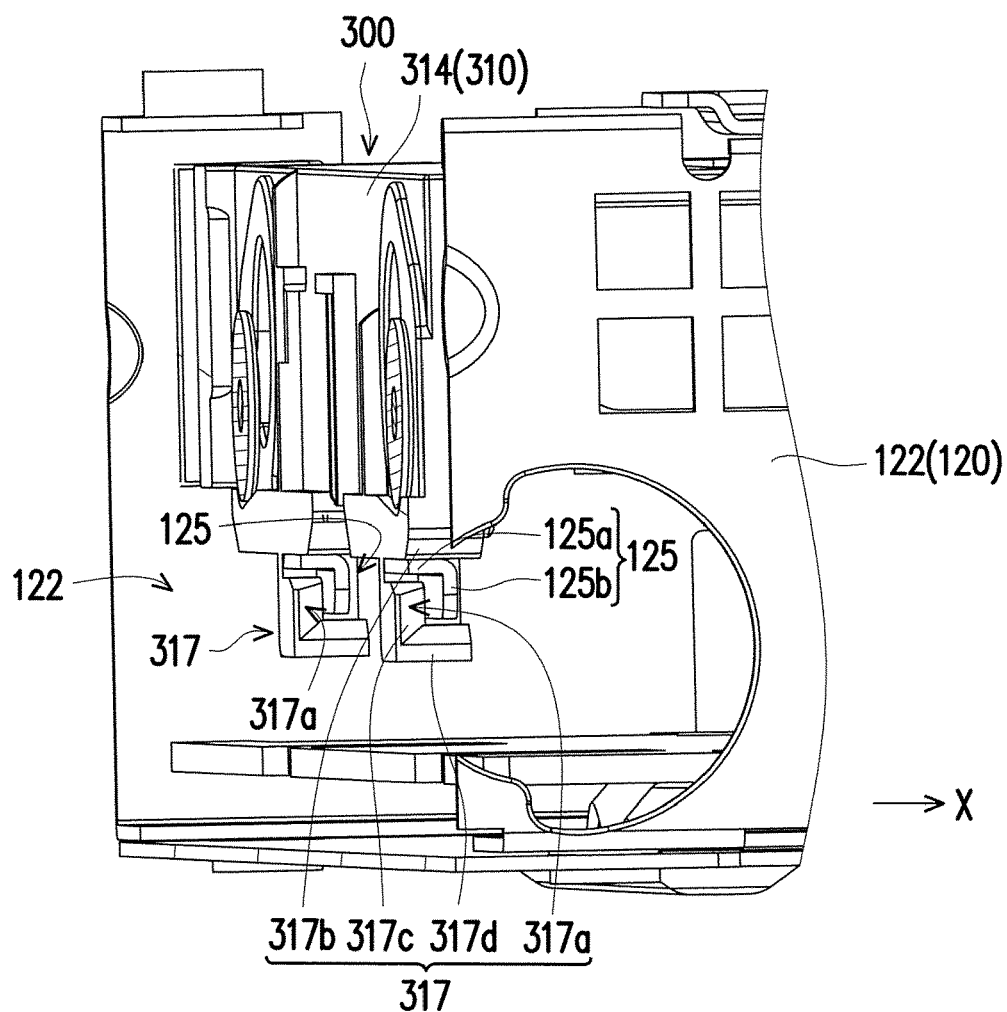
FIG. 6 is a partial 3D cross-sectional view of FIG. 1 along a section line I-I.

FIG. 1 is a three-dimensional (3D) view of a computer chassis according to an embodiment of the invention. FIG. 2 is a three-dimensional view of a fixing mechanism of the computer chassis of FIG. 1. FIG. 3 is an exploded view of the computer chassis of FIG. 1. FIG. 4 is a partial cross-sectional view of the computer chassis of FIG. 1. FIG. 5 is a partial 3D cross-sectional view of the computer chassis of FIG. 1. FIG. 6 is a partial 3D cross-sectional view of FIG. 1 along a section line I-I. For simplicity's sake, an electronic device is omitted in FIG. 6.

Referring to FIG. 1, FIG. 2, FIG. 3, FIG. 4 and FIG. 5, the computer chassis 10 of the present embodiment includes a casing 100, a circuit board 200, a fixing mechanism 300 and an electronic device 400. The casing 100 includes a bottom plate 110 and a plurality of side plates 120. The side plates 120 are connected to the bottom plate 110 and define an accommodating space S together with the bottom plate 110. The circuit board 200 is disposed on the casing 100 and is located in the accommodating space S. The circuit board 200 has a first position limiting opening 210 and a second position limiting opening 220. The fixing mechanism 300 is disposed on the casing 100, and is located in the accommodating space S. The fixing mechanism 300 includes a main member 310 and a first locking member 320. In the present embodiment, the main member 310 and the first locking member 320 are preferably an integral structure. The first locking member 320 is disposed at one side T1 of the main member 310, and the first locking member 320 includes a fixing portion 322, a support portion 324 and a stop portion 326. The fixing portion 322 includes a first part 322a and a second part 322b, and two ends of the first part 322a are respectively connected to the main member 310 and the second part 322b. The support portion 324 is connected to the fix portion 322, and the second part 322b and the support portion 324 are respectively located on two opposite surfaces S1, S2 of the first part 322a. The stop portion 326 is connected to the support portion 324, and is located on a bottom surface 324a of the support portion 324. The electronic device 400 is assembled in the main member 310 of the fixing mechanism 300, where the second part 322b and the stop portion 326 are respectively located in the first position limiting opening 210 and the second position limiting opening 220 to locking the first locking member 320 to the circuit board 200, the support portion 324 is located on the circuit board 200 to support the electronic device 400, so as to fix the fixing mechanism 300 in the casing 100. The electronic device 400 is, for example, a storage device such as a hard disk, etc., though the invention is not limited thereto.

In detail, referring to FIG. 2, the main member 310 of the fixing mechanism 300 of the present embodiment includes a top wall portion 312 and two opposite sidewall portions 314 connected to the top wall portion 312. The top wall portion 312 has an opening 312a, where the opening 312a is adapted to expose a part of an upper surface 410 of the electronic device 400. Each of the sidewall portions 314 has a plurality of assembly holes 315, and each of the assembly holes 315 has a first aperture portion 315a and a second aperture portion 315b communicatively connected to each other. An aperture of the first aperture portion 315a is greater than an aperture of the second aperture portion 315b, i.e. each of the assembly holes 315 is a gourd hole.

Referring to FIG. 1, FIG. 2, FIG. 3 and FIG. 5, the computer chassis 10 further includes a plurality of assembly parts 500, where the assembly parts 500 are assembled to the electronic device 400, and each of the assembly parts 500 is composed of a first elastic portion 510, a second elastic portion 520 and a penetration portion 530. An outer diameter of the first elastic portion 510 is smaller than an outer diameter of the second elastic portion 520, and the penetration portion 530 is embedded in the first elastic portion 510 and penetrates through the second elastic portion 520 to expose out of the second elastic portion 520. The assembly parts 500 are assembled to the electronic device 400 through the penetration portions 530, and the second elastic portions 520 lean against the electronic device 400. Preferably, each of the assembly parts 500 is put through the first aperture portion 315a of the corresponding assembly hole 315 and is fixed in the second aperture portion 315b, so as to fix the electronic device in the main member 310 of the fixing mechanism 300.

Moreover, as shown in FIG. 2, the main member 310 of the fixing mechanism 300 and the fixing portion 322 of the first locking member 320 have a seamless connection, where an extending direction of the first part 322a of the fixing portion 322 is perpendicular to an extending direction of the support portion 324, and an extending direction of the second part 322b is parallel to the extending direction of the support portion 324. Referring to FIG. 2 and FIG. 4, the second part 322b of the fixing mechanism 300 is embodied by a clasp, and the stop portion 326 has a bevel 326a. When the second part 322b of the fixing mechanism 300 is located in the first position limiting opening 210 of the circuit board 200 and is locked to an edge of the first position limiting opening 210, and the bevel 326a of the stop portion 326 is located in the second position limiting opening 220 and one side of the stop portion 326 leans against an edge of the second position limiting opening 220, the first locking member 320 is locked to the circuit board 200, and the support portion 324 is located on the circuit board 200 to support the fixing mechanism 300, so as to fix the fixing mechanism 300 in the casing 100.

In order to further fix the fixing mechanism 300 on the casing 100, referring to FIG. 2 and FIG. 5, the fixing mechanism 300 of the present embodiment further includes a second locking member 330 disposed at another side T2 of the main member 310 and connected to the main member 310. The second locking member 330 has a bending portion 332, and one of the side plates 120 of the casing 100 has an assembly opening 124, and the bending portion 332 is interfered with the assembly opening 124, i.e. located in the assembly opening 124 and exposed out of the assembly opening 124, so as to fix the fixing mechanism 300 in the casing 100.

Moreover, referring to FIG. 1, FIG. 2 and FIG. 6, a first inner surface 122 of one of the side plates 120 of the casing 100 of the present embodiment has a plurality of leaning portions 125, where the leaning portions 125 are formed by bending a part of the side plate 120 towards the first inner surface 122, and each of the leaning portions 125 has a first leaning portion 125a and a second leaning portion 125b. One of the sidewall portions 314 of the main member 310 of the fixing mechanism 300 is configured with the first locking member 320, and a second inner surface 314a of the other one of the sidewall portions 314 has a plurality of strengthening portions 317, where regarding the effect of configuring the strengthening portions 317, in addition to strengthening the structure strength of the main member 310, the strengthening portions 317 also have the function of interfering with the casing 100. Further, each of the strengthening portions 317 has an accommodating opening 317a, a first strengthening portion 317b, a second strengthening portion 317c, and a third strengthening portion 317d. The second strengthening portion 317c is located between the first strengthening portion 317b and the third strengthening portion 317d and defines the accommodating opening 317a together with the first strengthening portion 317b and the third strengthening portion 317d. When the fixing mechanism 300 containing the hard disk is assembled to the casing 100, the leaning portion 125 extends into the accommodating opening 317a, where the first leaning portion 125a is leaned against by the first strengthening portion 317b, and the second leaning portion 125b is located in the accommodating opening 317a and provide displacement positioning of a horizontal direction X to the second strengthening portion 317c, and the second leaning portion 125b may limit displacement of the fixing mechanism 300 in the horizontal direction X. In other words, the strengthening portions 317 may respectively lean against the leaning portions 125 to assist fixing the fixing mechanism 300 on the casing 100.

Moreover, in order to facilitate assembling/disassembling the fixing mechanism 300 to/from the casing 100, the fixing mechanism 300 of the present embodiment further includes a force exerting member 340, wherein the force exerting member 340 is connected to the support portion 324 of the first locking member 320 and includes a connection portion 342 and a force exerting portion 344. The connection portion 342 is connected to the support portion 324 and the force exerting portion 344, and an extending direction of the force exerting portion 344 is the same with an extending direction of the support portion 324. Preferably, the force exerting member 340 and the first locking member 320 have a seamless connection, i.e. the force exerting member 340 and the first locking member 320 are an integral structure.

When the fixing mechanism 300 is to be disassembled from the casing 100, an external force (for example, an upward force) may be exerted to the force exerting portion 344 of the force exerting member 340 to release the interference of the first positioning limiting opening 210 and the second position limiting opening 220 of the circuit board 200 to the second part 322b and the stop portion 326. Then, a force (for example, an inward force) is exerted to the second locking member 330, such that the bending portion 332 of the second locking member 330 is not interfered with the assembly opening 124 of the casing 100. Finally, the fixing mechanism 300 is lifted and taken out from the accommodating space S towards the extending direction of the second locking member 330, such that the fixing mechanism 300 is unlocked from the casing 100 and the circuit board 200.

In brief, the fixing mechanism 300 of the present embodiment may be an integral plastic member, and is assembled to the casing 100 and the circuit board 200 on the casing 100 in the buckling manner. Compared to the situation that the fixing mechanism and the casing are assembled through fastening members in a fastening manner, the fixing mechanism 300 of the present embodiment has advantages of saving components, production molds and assembling procedures, and it is unnecessary to additionally use other assembly components, i.e. a tool-less effect is achieved, so as to effectively reduce the production cost of the computer chassis 10 to improve competitiveness thereof.

In summary, in the design of the fixing mechanism of the invention, the electronic device is adapted to be assembled in the main member, and the first locking member includes the fixing portion, the support portion and the stop portion, where the fixing portion includes the first part and the second part, the first part is connected to the main member and the support portion, and the stop portion is located on the bottom surface of the support portion. When the fixing mechanism assembled with the electronic device is assembled on the casing of the computer chassis, the second part of the fixing portion and the stop portion are respectively located in the first position limiting opening and the second position limiting opening of the circuit board, such that the first locking member is locked to the circuit board, and the support portion is located on the circuit board to support the electronic device, so as to fix the fixing mechanism in the casing. Through the aforementioned method, it is unnecessary to use other additional assembly components, so that the production cost of the computer chassis is effectively reduced to improve product competitiveness.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A fixing mechanism, comprising:
  a main member; and
  a first locking member, disposed at one side of the main member, and the first locking member comprising:
    a fixing portion, comprising a first part and a second part, and two ends of the first part being respectively connected to the main member and the second part;
    a support portion, connected to the fix portion, and the second part and the support portion being respectively located on two opposite surfaces of the first part; and
    a stop portion, connected to the support portion, and located on a bottom surface of the support portion, wherein an electronic device is adapted to be assembled in the main member, and the first locking member is adapted to locking a circuit board of a computer chassis, so as to fix the fixing mechanism in a casing of the computer chassis.

2. The fixing mechanism as claimed in claim 1, wherein the main member comprises a top wall portion and two opposite sidewall portions connected to the top wall portion, each of the two sidewall portions has a plurality of assembly holes, and the electronic device is assembled with a plurality of assembly parts, and the plurality of assembly parts respectively penetrate through the plurality of assembly holes to fix the electronic device in the main member.

3. The fixing mechanism as claimed in claim 2, wherein each of the plurality of assembly holes has a first aperture portion and a second aperture portion communicatively connected to each other, an aperture of the first aperture portion is greater than an aperture of the second aperture portion, and each of the plurality of assembly parts is put through the first aperture portion and is fixed in the second aperture portion.

4. The fixing mechanism as claimed in claim 2, wherein one of the two sidewall portions is configured with the first locking member, an inner surface of the other one of the two sidewall portions has at least one strengthening portion, the at least one strengthening portion has an accommodating opening, a first strengthening portion, a second strengthening portion, and a third strengthening portion, the second strengthening portion is located between the first strengthening portion and the third strengthening portion and defines the accommodating opening together with the first strengthening portion and the third strengthening portion, and the accommodating opening is adapted to interfere the casing of the computer chassis to fix the fixing mechanism on the casing of the computer chassis.

5. The fixing mechanism as claimed in claim 1, further comprising:
  a second locking member, disposed at another side of the main member and connected to the main member, wherein the second locking member has a bending portion, and the bending portion is adapted to locking the casing of the computer chassis to fix the fixing mechanism in the casing of the computer chassis.

6. The fixing mechanism as claimed in claim 1, further comprising:
  a force exerting member, connected to the support portion of the first locking member and comprising a connection portion and a force exerting portion, wherein the connection portion is connected to the support portion and the force exerting portion, and an extending direction of the force exerting portion is the same with an extending direction of the support portion.

7. A computer chassis, comprising:
  a casing, comprising:
    a bottom plate;
    a plurality of side plates, connected to the bottom plate and defining an accommodating space together with the bottom plate;
  a circuit board, disposed on the casing and located in the accommodating space, and the circuit board having a first position limiting opening and a second position limiting opening;
  a fixing mechanism, assembled on the casing, and located in the accommodating space, the fixing mechanism comprising:
    a main member; and
    a first locking member, disposed at one side of the main member, and the first locking member comprises:

a fixing portion, comprising a first part and a second part, and two ends of the first part being respectively connected to the main member and the second part;

a support portion, connected to the fix portion, and the second part and the support portion being respectively located on two opposite surfaces of the first part; and a stop portion, connected to the support portion, and located on a bottom surface of the support portion; and an electronic device, assembled in the main member of the fixing mechanism, wherein the second part and the stop portion are respectively located in the first position limiting opening and the second position limiting opening to locking the first locking member to the circuit board, and the support portion is located on the circuit board to support the electronic device, so as to fix the fixing mechanism in the casing.

8. The computer chassis as claimed in claim 7, further comprising:

a plurality of assembly parts, assembled to the electronic device, wherein the main member comprises a top wall portion and two opposite sidewall portions connected to the top wall portion, each of the two sidewall portions has a plurality of assembly holes, and the plurality of assembly parts respectively penetrate through the plurality of assembly holes to fix the electronic device in the main member.

9. The computer chassis as claimed in claim 8, wherein each of the plurality of assembly holes has a first aperture portion and a second aperture portion communicatively connected to each other, an aperture of the first aperture portion is greater than an aperture of the second aperture portion, and each of the plurality of assembly parts is put through the first aperture portion and is fixed in the second aperture portion.

10. The computer chassis as claimed in claim 8, wherein a first inner surface of one of the plurality of side plates of the casing has a plurality of leaning portions, and each of the plurality of leaning portions has a first leaning portion and a second leaning portion, one of the two sidewall portions is configured with the first locking member, and a second inner surface of the other one of the two sidewall portions has a plurality of strengthening portions, each of the plurality of strengthening portions has an accommodating opening, a first strengthening portion, a second strengthening portion, and a third strengthening portion, the second strengthening portion is located between the first strengthening portion and the third strengthening portion and defines the accommodating opening together with the first strengthening portion and the third strengthening portion, the leaning portion extends into the accommodating opening, and the first leaning portion is leaned against by the first strengthening portion, and the second leaning portion is located in the accommodating opening and provide displacement positioning of a horizontal direction to the second strengthening portion, so as to fix the fixing mechanism on the casing.

11. The computer chassis as claimed in claim 7, wherein the fixing mechanism further comprises:

a second locking member, disposed at another side of the main member and connected to the main member, wherein the second locking member has a bending portion, one of the plurality of side plates of the casing has an assembly opening, and the bending portion is interfered with the assembly opening to fix the fixing mechanism in the casing.

12. The computer chassis as claimed in claim 7, wherein the fixing mechanism further comprises:

a force exerting member, connected to the support portion of the first locking member, and comprising a connection portion and a force exerting portion, wherein the connection portion is connected to the support portion and the force exerting portion, and an extending direction of the force exerting portion is the same with an extending direction of the support portion.

* * * * *